(12) United States Patent
Jang

(10) Patent No.: US 6,933,187 B2
(45) Date of Patent: Aug. 23, 2005

(54) METHOD FOR FORMING NARROW TRENCH STRUCTURES

(75) Inventor: Wen-Yueh Jang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 8 days.

(21) Appl. No.: 10/752,549

(22) Filed: Jan. 8, 2004

(65) Prior Publication Data

US 2005/0112812 A1 May 26, 2005

(51) Int. Cl.[7] .................. H01L 21/336; H01L 21/8234
(52) U.S. Cl. ...................................... 438/197; 438/443
(58) Field of Search ................................ 438/197, 216, 438/218, 248, 366, 404, 430, 443

(56) References Cited

U.S. PATENT DOCUMENTS

| 4,057,824 | A | * | 11/1977 | Woods | ........................ 257/507 |
|---|---|---|---|---|---|
| 5,254,218 | A | | 10/1993 | Roberts et al. | |
| 5,750,432 | A | * | 5/1998 | McLachlan | .................. 438/404 |
| 6,197,627 | B1 | * | 3/2001 | Kishi | .......................... 438/199 |
| 6,355,528 | B1 | | 3/2002 | Ishida et al. | |

* cited by examiner

Primary Examiner—Phuc T. Dang
(74) Attorney, Agent, or Firm—Birch, Stewart, Kolasch & Birch, LLP

(57) ABSTRACT

A method for forming narrow trench structures. A substrate covered by a layer to be defined is provided. A plurality of oxidable first masking islands is formed on the layer to be defined. Thereafter, the first masking islands are oxidized to form an oxide layer on the sidewall and the upper surface of each first masking island. A second masking island is formed in each gap between the oxidized first masking islands. The oxide layers are subsequently removed to form narrow openings between the first and second masking islands, having a width substantially equal to the thickness of the removed oxide layer. The layer to be defined underlying the narrow openings is etched to form the narrow trench structures on the substrate. Finally, the first and second masking islands are removed.

13 Claims, 6 Drawing Sheets

METHOD FOR FORMING NARROW TRENCH STRUCTURES

BACKGROUND OF THE INVENTION

1. Field of the Invention

The present invention relates in general to a semiconductor process, and more particularly, to a method for forming narrow trench structures.

2. Description of the Related Art

In order to increase the integration of integrated circuits (ICs), one trend in the semiconductor industry is to make the semiconductor devices or device-to-device spacing as small as possible, thereby enabling fabrication of more semiconductor devices in the predetermined area on a chip to raise the operating speed and performance of ICs.

Metal oxide semiconductor (MOS) transistors are common semiconductor devices. The fabrication of the MOS transistor includes successively forming a gate dielectric layer, a conductive layer, and a photoresist layer on a substrate. Thereafter, lithography is performed on the photoresist layer to form gate patterns therein. Finally, the gate patterns are transferred onto the conductive layer by etching. Accordingly, line/space width is limited by the resolution of the available lithography equipment. As a result, the lithography resolution is critical for increasing device density. In other words, the IC integration is limited by photoresist properties and the light wavelength for exposure. The lithography resolution can be raised by specific photoresist or lithography equipment, but the fabrication cost may increase. In light of the foregoing, there exists a need for a method to increase the integration of ICs without being limited by lithography.

U.S. Pat. No. 5,254,218 discloses a method for forming narrow isolated trenches, wherein a conformable polysilicon layer is formed on the surface of the masking islands formed on a substrate and covers the substrate. Thereafter, a silicon oxide masking layer is formed on both sides of each masking island and covers the polysilicon layer on the substrate. Finally, the polysilicon layer on the upper surface and sidewall of each masking island is removed to form openings for defining narrow trenches. In this method, no specific photoresist or lithography equipment is required. The uniformity of the polysilicon layer formed by CVD with poor step coverage, is however reduced, due to the varying dimensions of the narrow trenches. Moreover, since the polysilicon layer on the substrate is covered by the silicon oxide masking layer, undercut occurs during etching of the uncovered polysilicon layer. As a result, the dimensions of the narrow trenches are difficult to precisely control.

Additionally, U.S. Pat. No. 6,355,528 discloses a method to form narrow structures using a dual damascene process, which employs an anisotropic etching to form spacers on the sidewalls of the masking islands. The space between each masking island is subsequently filled with another masking layer. Finally, the spacers are removed to form narrow openings for forming the narrow structures. The spacers formed by anisotropic etching, however, cannot have a vertical profile. As a result, the dimensions of the narrow structures are also difficult to precisely control.

SUMMARY OF THE INVENTION

Accordingly, it is an object of the present invention to provide a method for forming narrow trench structures and a method for forming gate structures with narrow spacings, which employ the space left by removing spacers to narrow the intervals between devices, thereby increasing the device density without being limited by lithography.

It is another object of the invention to provide a method for forming narrow trench structures and a method for forming gate structures with narrow spacings, which uses oxidation to form oxide layers serving as spacers, thereby increasing the uniformity of the spacer thickness to accomplish an easily controlled and stable process.

According to the object of the invention, a method for forming gate structures with narrow spacings is provided. First, a substrate is provided. Next, a dielectric layer, a polysilicon layer, and a capping layer are successively formed on the substrate. A plurality of silicon islands is subsequently formed on the capping layer. The silicon islands are oxidized to form an oxide layer on the sidewall and the upper surface of each silicon island. Next, a masking layer is formed in each gap between the oxidized silicon islands. Next, the oxide layers are removed to form a narrow opening between each of the silicon islands and the masking layers, having a width substantially equal to the thickness of the removed oxide layer. Thereafter, the cap layer and the polysilicon layer underlying the narrow openings are etched to form the gate structures with narrow spacings on the substrate. Finally, the silicon islands, the masking layers, and the capping layer are removed.

Moreover, the capping layer can be a silicon nitride layer and the masking layer can be a photoresist or silicon layer.

Additionally, according to the object of the invention, a method for forming narrow trench structures is provided. First, a substrate covered by a layer to be defined is provided and a plurality of oxidable first masking islands is subsequently formed on the layer to be defined. Thereafter, the first masking islands are oxidized to form an oxide layer on the sidewall and the upper surface of each first masking island. Next, a second masking island is formed in each gap between the oxidized first masking islands. The oxide layers are subsequently removed to form narrow openings between the first and second masking islands, having a width substantially equal to the thickness of the removed oxide layer. Next, the layer to be defined underlying the narrow openings is etched to form the narrow trench structures on the substrate. Finally, the first and second masking islands are removed.

Additionally, the layer to be defined can be a silicon layer, a metal layer, or a dielectric layer.

Moreover, the first masking island can be composed of silicon and the second masking island can be composed of photoresist or silicon.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
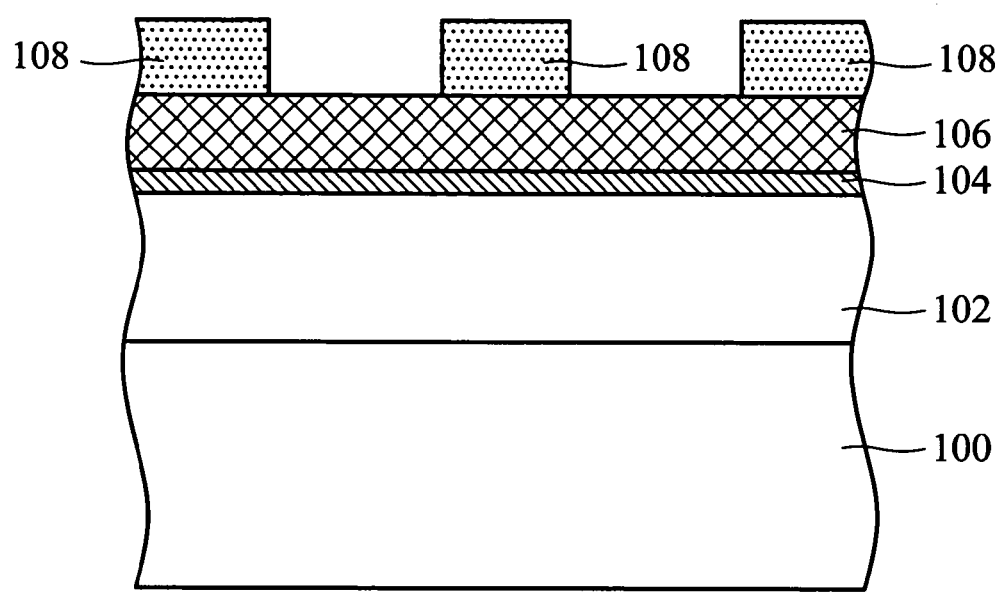
FIGS. 1a to 1f are cross-sections showing a method for forming narrow trench structures according to the invention.

In FIG. 1a, a substrate 100, such as a silicon substrate or other semiconductor substrate, is provided. The substrate 100 may contain a variety of elements, including, for example, transistors, capacitors, and other semiconductor elements as are well known in the art. The substrate 100 may also contain other insulating layers or metal interconnect layers. Here, a flat substrate is depicted for simplicity.

Next, a layer to be defined 102 is deposited on the substrate 100 by conventional deposition. In the invention, the layer to be defined 102 may be a silicon layer, a metal layer, or other well known dielectric layer used in the semiconductor process. Thereafter, a capping layer 104 with a thickness of about 50 to 1000 Å is optionally formed on the layer to be defined 102 to serve as a protective layer. In the invention, the capping layer 104 is composed of an anti-oxidation material, such as a silicon nitride layer.

Next, a masking layer 106 is formed on the capping layer 104 to serve as an etch mask. In the invention, the masking layer 106 may be composed of an oxidable material. Moreover, the oxidized film has a high etching selectivity with respect to the masking layer 106, such as silicon. Next, a photoresist layer 108 with island patterns is formed on the masking layer 106 by lithography, as shown in FIG. 1a.

Figure 1B:
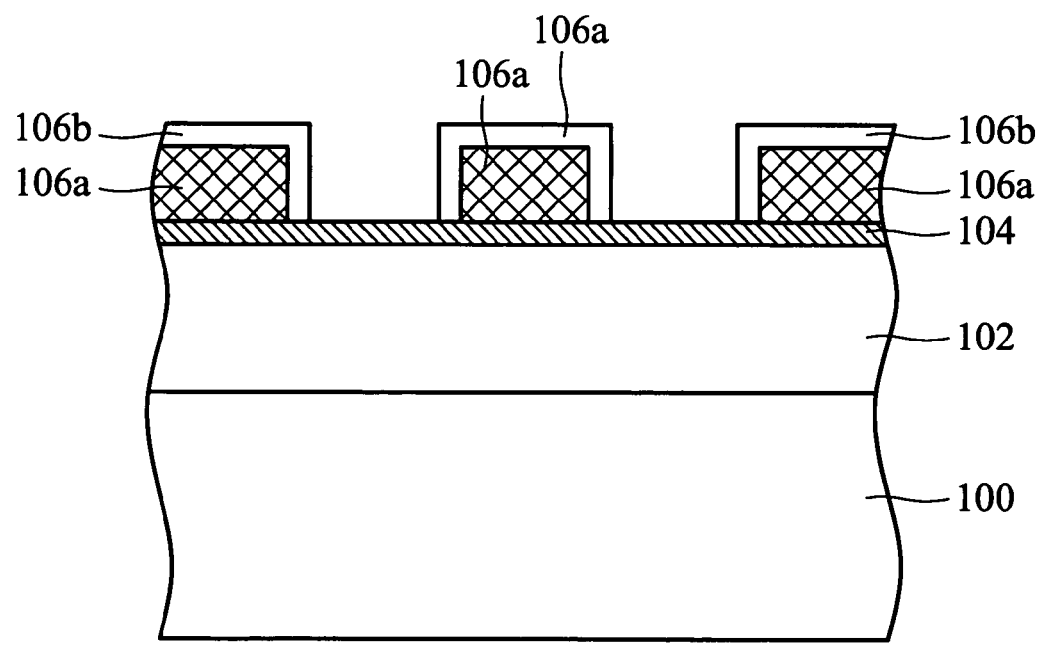

Next, in FIG. 1b, the masking layer 106 uncovered by the photoresist layer 108 is removed by, for example, reactive ion etching (RIE), to form a plurality of masking islands 106a. Thereafter, the photoresist layer 108 is removed by ashing or other suitable solutions. A critical step of the invention is subsequently performed. That is, spacers are formed on the sidewalls of masking islands 106a. For example, masking islands 106a are thermally oxidized to form an oxide layer 106b on the sidewall and the upper surface of each masking island 106a, wherein the oxide layer 106b formed on the sidewall of each masking island 106a is used as the spacer. As mentioned above, since the capping layer 104 is composed of an anti-oxidation material, oxygen diffusing into the underlying layer to be defined 102 can be prevented. Here, the width of the narrow trench structure is based on the thickness of the oxide layer 106b. Accordingly, the temperature and the length of the thermal oxidation can be determined according to the demand.

Figure 1C:
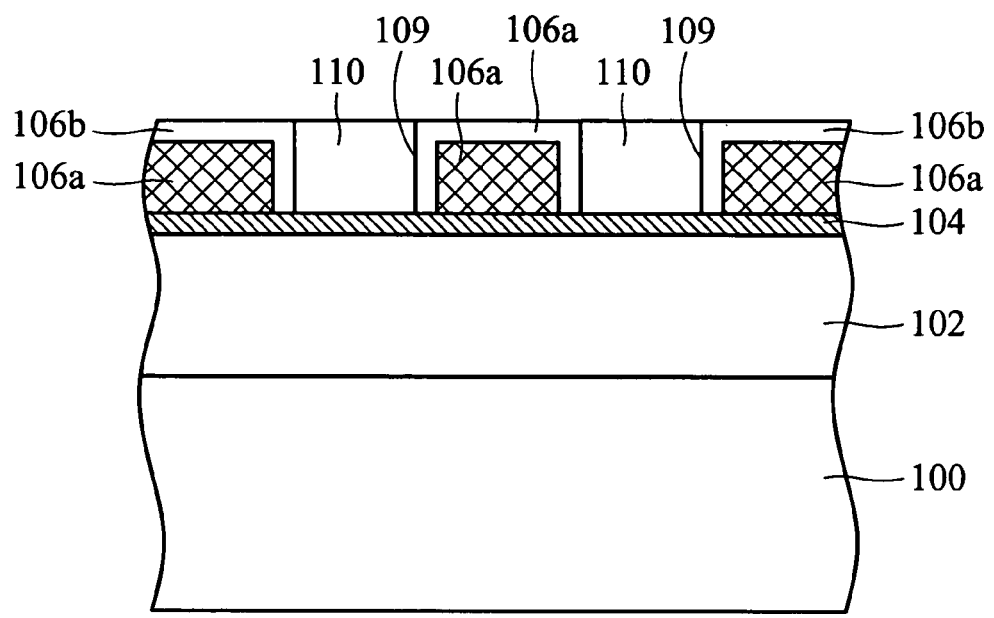

Next, in FIG. 1c, another masking layer (not shown) is formed on the oxide layer 106b and fills each gap 109 between the masking islands 106a. In the invention, the masking layer may have a high etching selectivity with the oxide layer 106b or a higher polishing rate than the oxide layer 106b. For example, the masking layer is composed of photoresist or silicon, with photoresist being preferable. Thereafter, the masking layer over the masking islands 106a is removed by etching back or conventional polishing, such as chemical mechanical polishing (CMP), using the oxide layers 106b as stoppers to leave a portion of masking layer 110 in each gap 109.

Figure 1D:
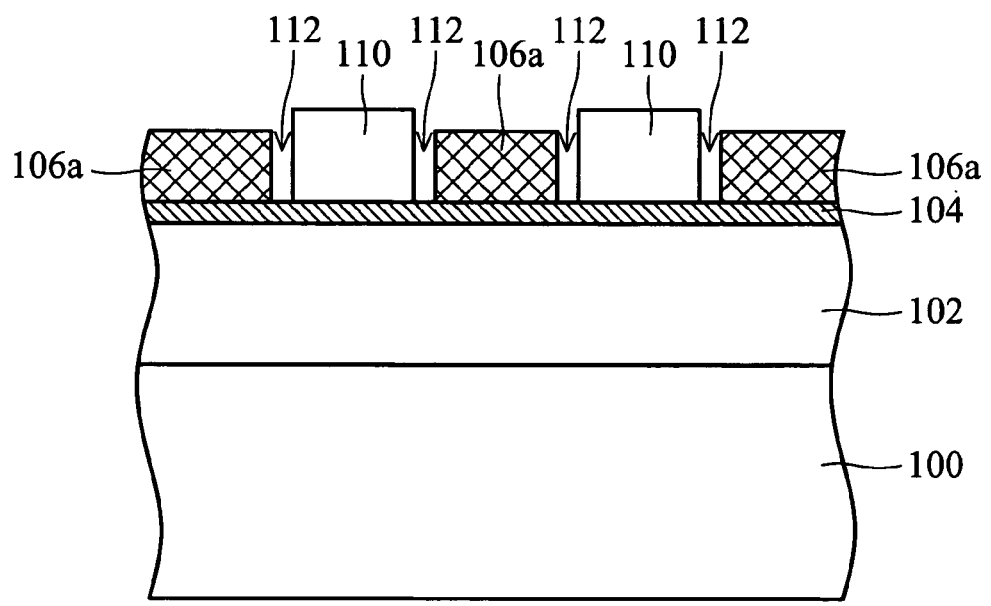

Next, in FIG. 1d, the oxide layers 106b are removed by conventional dry or wet etching to simultaneously expose the surfaces of the masking islands 106a and the capping layer 104 and form a narrow opening 112 between each of the masking islands 106a and the remaining masking layers 110, having a width substantially equal to the thickness of the removed oxide layer 106b.

Figure 1E:
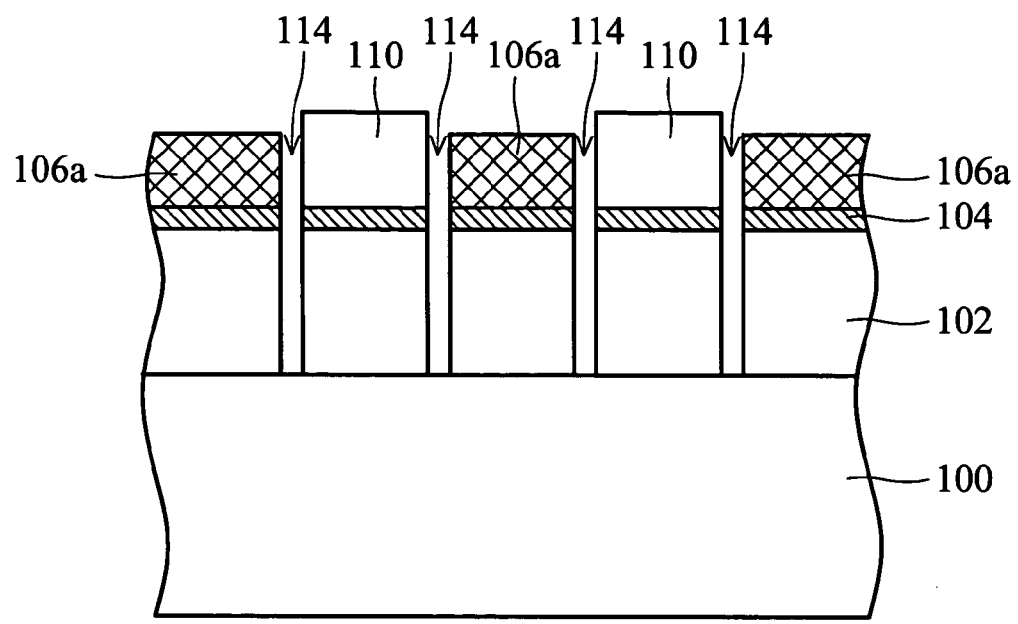
Figure 1F:
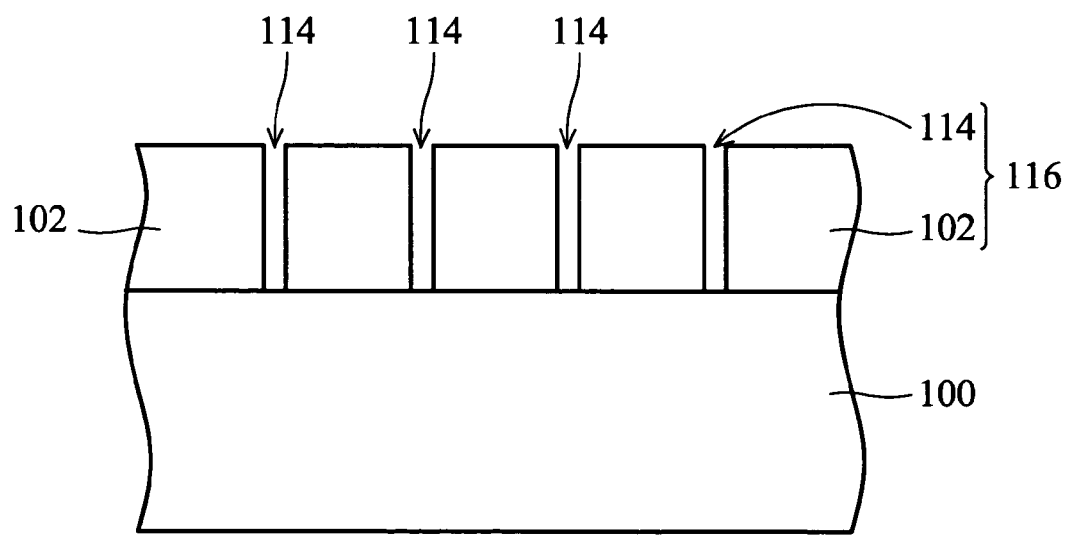

Next, in FIG. 1e, the capping layer 104 and the layer to be defined 102 underlying the openings 112 are successively etched using the masking islands 106a and the remaining masking layers 110 as etch masks to form openings 114 and expose the substrate 100. Finally, the masking islands 106a, the remaining masking layers 110, and the capping layer 104 are removed to complete the fabrication of the narrow trench structures 116, as shown in FIG. 1f.

FIGS. 2a to 2f are cross-sections showing a method for forming gate structures with narrow spacings according to the invention. First, in FIG. 2a, a substrate 200, such as a silicon substrate or other semiconductor substrate, is provided. The substrate 200 may contain a variety of elements, including, for example, transistors, capacitors, and other semiconductor elements as are well known in the art. The substrate 100 may also contain other insulating layers or metal interconnect layers. Here, a flat substrate is depicted for simplicity.

Next, a dielectric layer 202 and a polysilicon layer 204 are deposited on the substrate 200. Here, the dielectric layer 202 may be a silicon oxide layer formed by thermal oxidation to serve as a gate dielectric layer. Moreover, the polysilicon layer 204 may be formed by conventional deposition, such as chemical vapor deposition (CVD), for defining the gate electrode. Thereafter, a capping layer 206 with a thickness of about 50 to 500 Å is formed on the polysilicon layer 204. The capping layer 206 may be composed of an anti-oxidation material, such as a silicon nitride layer.

Next, a masking layer 208 is formed on the capping layer 206 to serve as an etch mask for defining the gate electrode. In the invention, the masking layer 208 may be composed of an oxidable material. Moreover, the oxidized film has a high etching selectivity with respect to the masking layer 208, such as silicon.

Figure 2A:
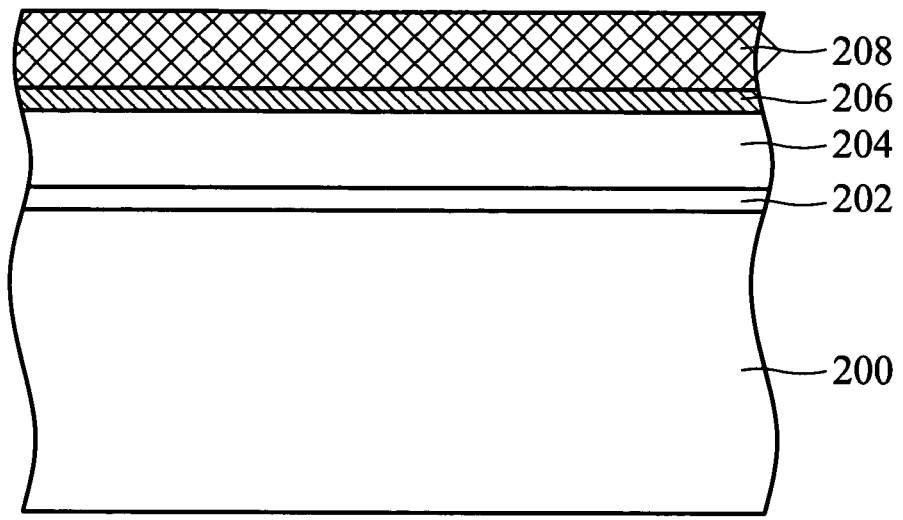
FIGS. 2a to 2f are cross-sections showing a method for forming gate structures with narrow spacings according to the invention.
Figure 2B:
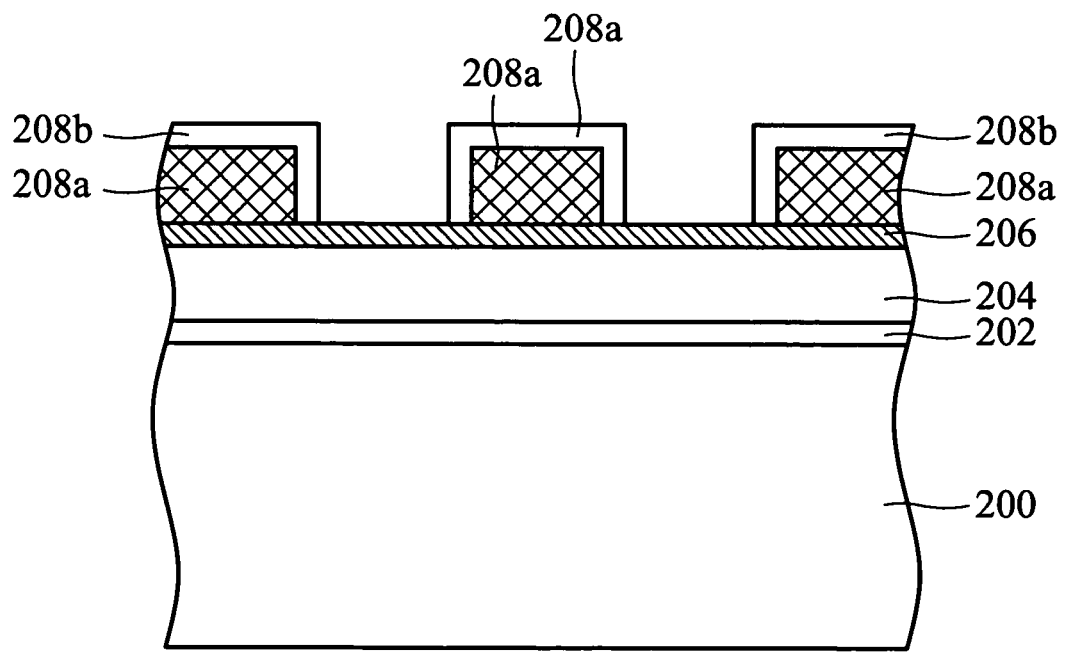

Next, in FIG. 2b, a plurality of masking islands 208a is formed on the capping layer 206 by lithography and etching. A critical step of the invention is subsequently performed. That is, spacers are formed on the sidewalls of masking islands 208a. For example, masking islands 208a are thermally oxidized to form an oxide layer 208b on the sidewall and the upper surface of each masking island 208a, wherein the oxide layer 208b formed on the sidewall of each masking island 208a is used as the spacer. As mentioned above, since the capping layer 206 is composed of an anti-oxidation material, oxygen diffusing into the underlying polysilicon layer 204 can be prevented. Here, the width of the narrow spacings between the gate structures is based on the thickness of the oxide layer 208b. Accordingly, the temperature and the length of the thermal oxidation can be determined according to the demand.

Figure 2C:
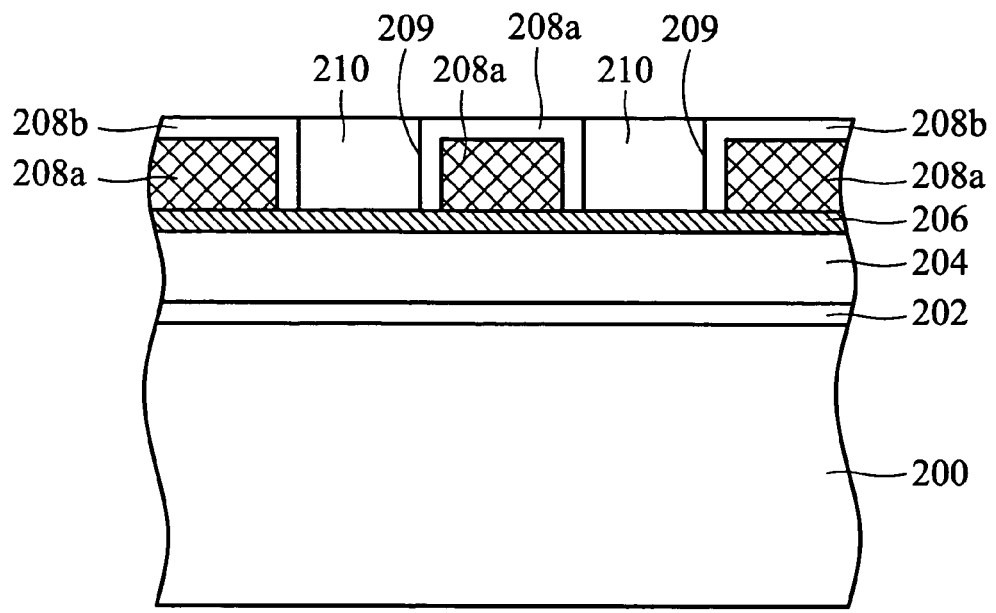

Next, in FIG. 2c, another masking layer (not shown) is formed on the oxide layer 208b and fills in each gap 209 between the masking islands 208a. In the invention, the masking layer may a have high etching selectivity with the oxide layer 208b or a higher polishing rate than the oxide layer 208b. For example, the masking layer is composed of photoresist or silicon, with photoresist being preferable. Thereafter, the masking layer over the masking islands 208a is removed by etching back or conventional polishing, such as CMP, using the oxide layers 208b as stoppers to leave a portion of masking layer 210 in each gap 209.

Figure 2D:
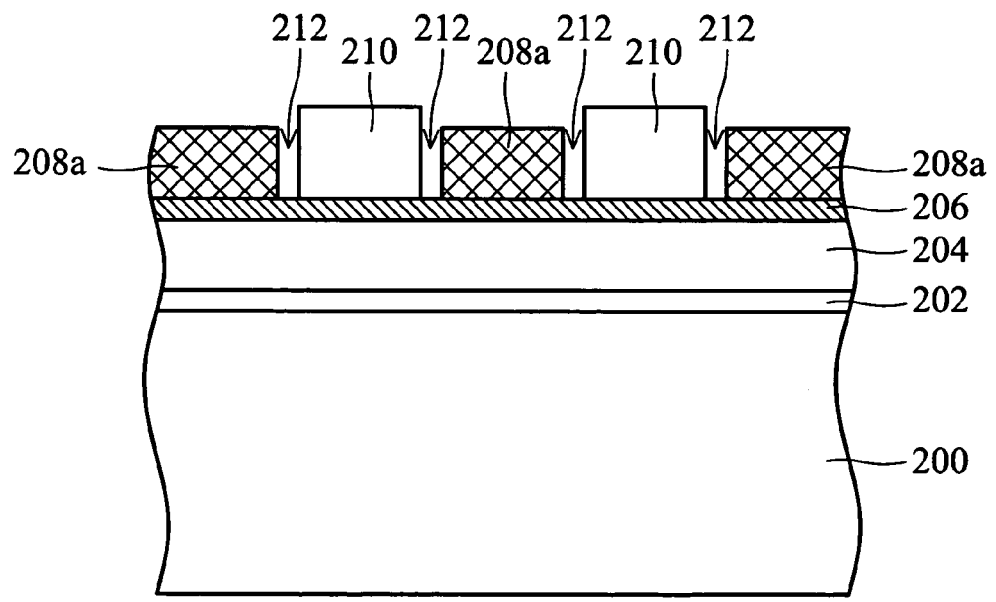

Next, in FIG. 2d, the oxide layers 208b are removed by conventional dry or wet etching to simultaneously expose the surfaces of the masking islands 208a and the capping layer 206 and form a narrow opening 212 between each of the masking islands 208a and the remaining masking layers 210, having a width substantially equal to the thickness of the removed oxide layer 208b.

Figure 2E:
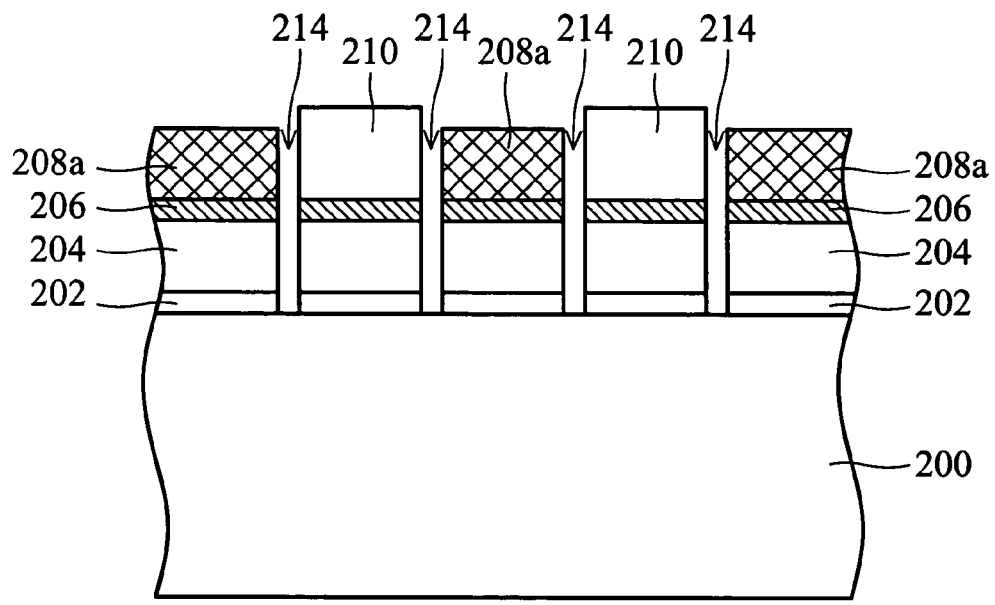
Figure 2F:
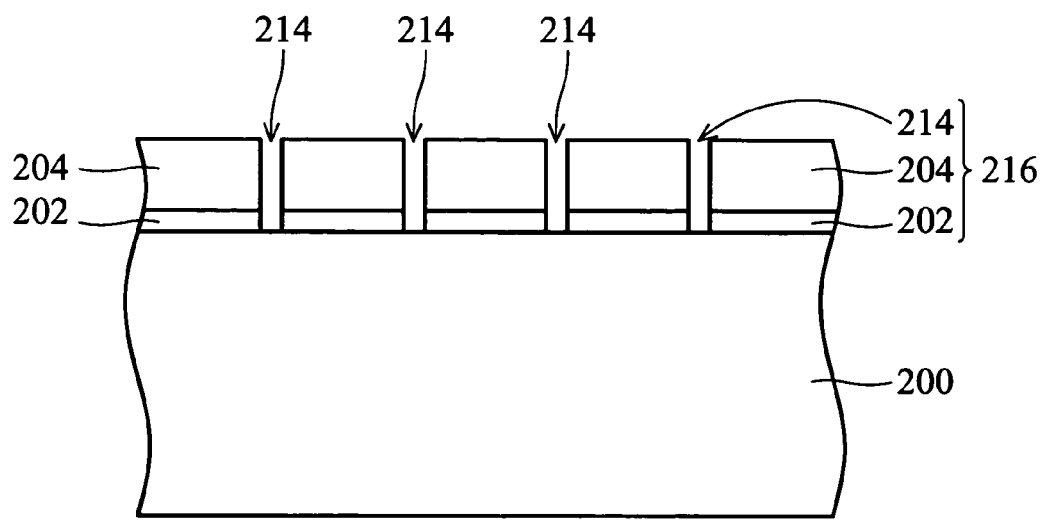

Next, in FIG. 2e, the capping layer 206, the polysilicon layer 204, and the dielectric layer 202 underlying the openings 212 are successively etched using the masking islands 208a and the remaining masking layers 210 as etch masks to form openings 214 and expose the substrate 200. Finally, the masking islands 208a, the remaining masking layers 210, and the capping layer 206 are removed to complete the fabrication of the gate structures 116 with narrow spacings, as shown in FIG. 2f.

According to the invention, the dimensions of the narrow trench or the dimensions of the gap between each gate structure is based on the thickness of the oxide spacer formed by thermal oxidation. Accordingly, device-to-device spacing can be reduced without being limited by lithography, thereby increasing device density. That is, integration of the integrated circuits can be increased. Additionally, compared to the related art, the spacer of the invention is formed by thermal oxidation, which offers better uniformity of thickness and vertical profile. Accordingly, the dimensions of the narrow trench or the dimensions of the gap between each gate structure can be precisely and stably controlled.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for forming gate structures with narrow spacings, comprising the steps of:
   providing a substrate;
   successively forming a dielectric layer, a polysilicon layer, and a capping layer on the substrate;
   forming a plurality of silicon islands on the capping layer;
   oxidizing the silicon islands to form an oxide layer on the sidewall and the upper surface of each silicon island;
   forming a masking layer in each gap between the oxidized silicon islands;
   removing the oxide layers to form a narrow opening between each of the silicon islands and the masking layers, having a width substantially equal to the thickness of the removed oxide layer;
   successively etching the cap layer and the polysilicon layer underlying the narrow openings to form the gate structures with narrow spacings on the substrate; and
   removing the silicon islands, the masking layers, and the capping layer.

2. The method as claimed in claim 1, wherein the capping layer is a silicon nitride layer.

3. The method as claimed in claim 1, wherein the masking layer is a photoresist layer.

4. The method as claimed in claim 1, wherein the masking layer is a silicon layer.

5. A method for forming narrow trench structures, comprising the steps of:
   providing a substrate covered by a layer to be defined;
   forming a plurality of oxidable first masking islands on the layer to be defined;
   oxidizing the first masking islands to form an oxide layer on the sidewall and the upper surface of each first masking island;
   forming a second masking island in each gap between the oxidized first masking islands;
   removing the oxide layers to form narrow openings between the first and second masking islands, each one having a width substantially equal to the thickness of the removed oxide layer;
   etching the layer to be defined underlying the narrow openings to form the narrow trench structures on the substrate; and
   removing the first and second masking islands.

6. The method as claimed in claim 5, further forming a capping layer on the layer to be defined before forming the first masking islands.

7. The method as claimed in claim 6, wherein the capping layer is a silicon nitride layer.

8. The method as claimed in claim 6, wherein the layer to be defined is a silicon layer.

9. The method as claimed in claim 6, wherein the layer to be defined is a metal layer.

10. The method as claimed in claim 5, wherein the layer to be defined is a dielectric layer.

11. The method as claimed in claim 5, wherein the first masking island is silicon.

12. The method as claimed in claim 5, wherein the second masking island is photoresist.

13. The method as claimed in claim 5, wherein the second masking island is silicon.

* * * * *